US011881455B2

(12) United States Patent
Park et al.

(10) Patent No.: US 11,881,455 B2
(45) Date of Patent: Jan. 23, 2024

(54) THROUGH SILICON BURIED POWER RAIL IMPLEMENTED BACKSIDE POWER DISTRIBUTION NETWORK SEMICONDUCTOR ARCHITECTURE AND METHOD OF MANUFACTURING THE SAME

(71) Applicant: SAMSUNG ELECTRONICS CO., LTD., Suwon-si (KR)

(72) Inventors: Saehan Park, Clifton Park, NY (US); Hoonseok Seo, Niskayuna, NY (US); Gil Hwan Son, Clifton Park, NY (US); Byounghak Hong, Albany, NY (US); Kang Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 17/389,622

(22) Filed: Jul. 30, 2021

(65) Prior Publication Data

US 2022/0384345 A1 Dec. 1, 2022

Related U.S. Application Data

(60) Provisional application No. 63/191,064, filed on May 20, 2021.

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76898* (2013.01); *H01L 21/8221* (2013.01);
(Continued)

(58) Field of Classification Search
CPC .......... H01L 23/5286; H01L 21/76898; H01L 21/8221; H01L 23/481; H01L 27/0694;
(Continued)

(56) References Cited

U.S. PATENT DOCUMENTS

2014/0367777 A1* 12/2014 Huang ................ H01L 29/7816
438/459
2020/0105671 A1 4/2020 Lai et al.
(Continued)

OTHER PUBLICATIONS

Prasad, Divya et al., "Buried Power Rails and Back-side Power Grids: Arm® CPU Power Delivery Network Design Beyond 5nm", Conference Paper, Dec. 2019,. (5 pages total).

*Primary Examiner* — Herve-Louis Y Assouman
(74) *Attorney, Agent, or Firm* — Sughrue Mion, PLLC

(57) ABSTRACT

Provided is a semiconductor architecture including a wafer, a first semiconductor device provided on a first surface of the wafer, the first semiconductor device being configured to route signals, a second semiconductor device provided on a second surface of the wafer opposite to the first surface of the wafer, the second semiconductor device being configured to supply power, and a buried power rail (BPR) included inside of the wafer and extending from the first surface of the wafer to the second surface of the wafer, the BPR being configured to deliver the power from the second semiconductor device to the first semiconductor device.

8 Claims, 25 Drawing Sheets

(51) Int. Cl.
  *H01L 21/822*  (2006.01)
  *H01L 23/48*  (2006.01)
  *H01L 27/06*  (2006.01)
  *H01L 23/532*  (2006.01)
  *H01L 21/8234*  (2006.01)
  *H01L 23/535*  (2006.01)
  *H01L 23/485*  (2006.01)

(52) U.S. Cl.
  CPC ........ *H01L 23/481* (2013.01); *H01L 27/0694* (2013.01); *H01L 23/53209* (2013.01); *H01L 23/53228* (2013.01); *H01L 23/53242* (2013.01); *H01L 23/53257* (2013.01)

(58) Field of Classification Search
  CPC ......... H01L 23/53209; H01L 23/53228; H01L 23/53242; H01L 23/53257; H01L 21/76895; H01L 21/823475; H01L 23/535; H01L 23/485; H01L 21/76224; H01L 21/76841; H01L 21/76877; H01L 23/49827
  See application file for complete search history.

(56) References Cited

U.S. PATENT DOCUMENTS

| | | |
|---|---|---|
| 2020/0152508 A1 | 5/2020 | Jourdain et al. |
| 2020/0203276 A1 | 6/2020 | Hiblot et al. |
| 2020/0266169 A1 | 8/2020 | Kang et al. |
| 2020/0373331 A1* | 11/2020 | Kim ................. H01L 21/76898 |

\* cited by examiner

THROUGH SILICON BURIED POWER RAIL IMPLEMENTED BACKSIDE POWER DISTRIBUTION NETWORK SEMICONDUCTOR ARCHITECTURE AND METHOD OF MANUFACTURING THE SAME

CROSS-REFERENCE TO THE RELATED APPLICATION

This application is based on and claims benefit to U.S. Provisional Application No. 63/191,064 filed on May 20, 2021 in the U.S. Patent and Trademark Office, the disclosure of which is incorporated herein in its entirety by reference.

BACKGROUND

1. Field

Example embodiments of the present disclosure relate to a backside power distribution network (BSPDN) semiconductor architecture and a method of manufacturing the same, and more particularly to a BSPDN semiconductor architecture including a through silicon buried power rail (BPR) and a method of manufacturing the same.

2. Description of Related Art

A BSPDN semiconductor architecture separates a signal wiring layer configured to route signals from a power distribution network (PDN) in a semiconductor architecture by providing semiconductor device such as an integrated circuit including active transistors, signal wires, and buried power rails (BPRs) on a first side of a wafer and providing the PDN on a second side of the wafer. The BSPDN semiconductor architecture may minimize routing congestion and allow for down scaling of its size. A BSPDN semiconductor architecture may result in a about 30% reduction in size and an improved current-resistance (IR) drop as compared to a general PDN semiconductor architecture in which a signal wiring layer and a PDN are provided on a same side of a wafer.

However, there may be difficulties in manufacturing BSPDN semiconductor architectures because accurately aligning an integrated circuit and a PDN provided on each side of a wafer may be difficult. For example, a misalignment between a buried power rail (BPR) formed on one side of a wafer with a through-silicon via (TSV) protruding from the PDN formed on the other side of the wafer may occur and an interface may be formed between the BPR and the TSV. Such misalignment and interface formed between the BPR and the TSV may lead to an increase in resistance and device failure of the semiconductor architecture.

In addition, a BPR is generally formed prior to performing a front-end-of-line (FEOL) processing of the semiconductor architecture that produces active devices such as epitaxial layers and gates. A relatively high temperature that is greater than about 1000° C. is usually required when forming the FEOL layers in the semiconductor architecture. As a BPR includes a metal material such as, for example, cobalt, tungsten, or ruthenium, the BPR may be degraded by metal migration or diffusion occurring when the FEOL layers are formed at a high temperature. Such metal migration or diffusion of the BPR may cause tool contamination and increase leakage which may lead to a device degradation or failure.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a backside power distribution network (BSPDN) semiconductor architecture and a method of manufacturing the same.

One or more example embodiments also provide to a BSPDN semiconductor architecture including a through silicon BPR and a method of manufacturing the same.

According to an aspect of an example embodiment, there is provided a semiconductor architecture including a carrier substrate, a first semiconductor device provided on a first surface of the carrier substrate, the first semiconductor device being configured to route signals, a second semiconductor device provided on a second surface of the carrier substrate opposite to the first surface of the carrier substrate, the second semiconductor device being configured to supply power, and a buried power rail (BPR) included inside of the carrier substrate and extending from the first surface of the carrier substrate to the second surface of the carrier substrate, the BPR being configured to deliver the power from the second semiconductor device to the first semiconductor device.

According to another aspect of an example embodiment, there is provided a method of manufacturing a semiconductor architecture, the method including providing a carrier substrate, patterning fins on the carrier substrate, providing an oxide layer on the carrier substrate and the fins, providing a first trench from a first surface of the carrier substrate to a level lower than the fins in a vertical direction, filling the first trench with an oxide fill material to a level of the first surface of the carrier substrate, providing an etch stop layer on the oxide fill material, providing a first semiconductor device on the first surface of the carrier substrate, the first semiconductor device being configured to route signals, providing a second trench from a second surface of the carrier substrate opposite to the first surface to a level of the oxide fill material, removing the oxide fill material and the etch stop layer to form a space in the first trench, filling the space in the first trench and the second trench with a metal material to form a buried power rail (BPR), providing a second semiconductor device on the second surface of the carrier substrate, the second semiconductor device being configured to supply power.

According to another aspect of an example embodiment, there is provided a semiconductor architecture including a carrier substrate, a first semiconductor device provided on a first surface of the carrier substrate, the first semiconductor device being configured to route signals, a second semiconductor device provided on a second surface of the carrier substrate opposite to the first surface of the carrier substrate, the second semiconductor device being configured to deliver power, a buried power rail (BPR) included inside of the carrier substrate and extending from the first surface of the carrier substrate to the second surface of the carrier substrate, wherein the BPR includes a first BPR portion and a second BPR portion, and wherein a width of the first BPR portion is different from a width of the second BPR portion.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
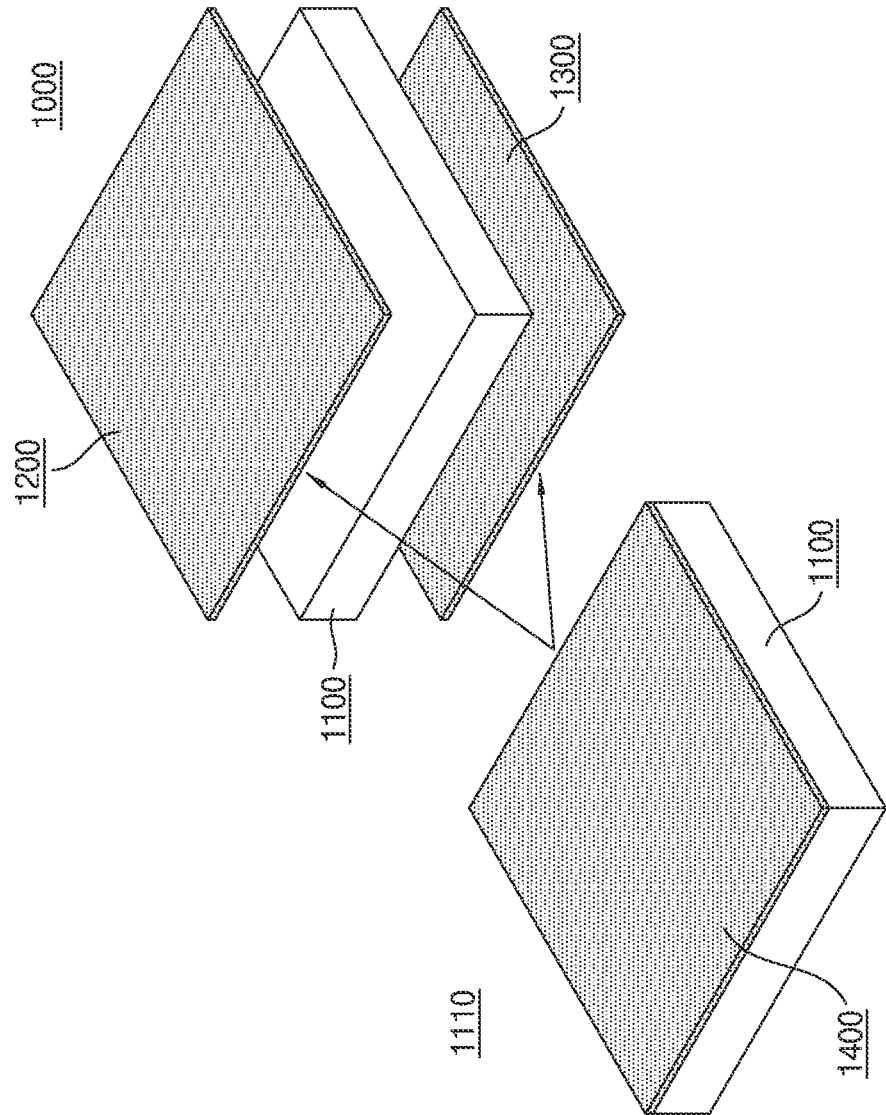
FIG. 1 illustrates a perspective view of a general PDN semiconductor architecture according to a related art and a BSPDN semiconductor architecture according to an example embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

FIG. 1 illustrates a perspective view of a general PDN semiconductor architecture according to a related art and a BSPDN semiconductor architecture according to an example embodiment.

Referring to FIG. 1, a general PDN semiconductor architecture 1110 includes a PDN/signal wiring device 1140 formed on one side of the wafer 1100. However, such configuration of the general PDN semiconductor architecture 1110 causes routing congestion in the PDN/signal wiring device 1140 and increases a size of the general PDN semiconductor architecture 1110. In addition, a resistance of the general PDN semiconductor architecture 1110 may be relatively high.

As illustrated in FIG. 1, according to an example embodiment, a BSPDN semiconductor architecture 1000 is configured to separate the signal wiring semiconductor device 1200, to be provided a first side of the wafer 1100, from a power distribution network (PDN) semiconductor device 1500 to be provided on a second side of the wafer 1100 opposite to the signal wiring semiconductor device 1200. The BSPDN semiconductor architecture 1000 according to an example embodiment may reduce the routing congestion and a size of the BSPDN semiconductor architecture 1000 by removing the PDN from the first side of the wafer 1100, and hence may also improve an IR drop. For example, a size of the BSPDN semiconductor architecture 1000 may be reduced by 30% compared to the general PDN semiconductor architecture 1110. However, embodiments are not limited thereto.

Figure 2:
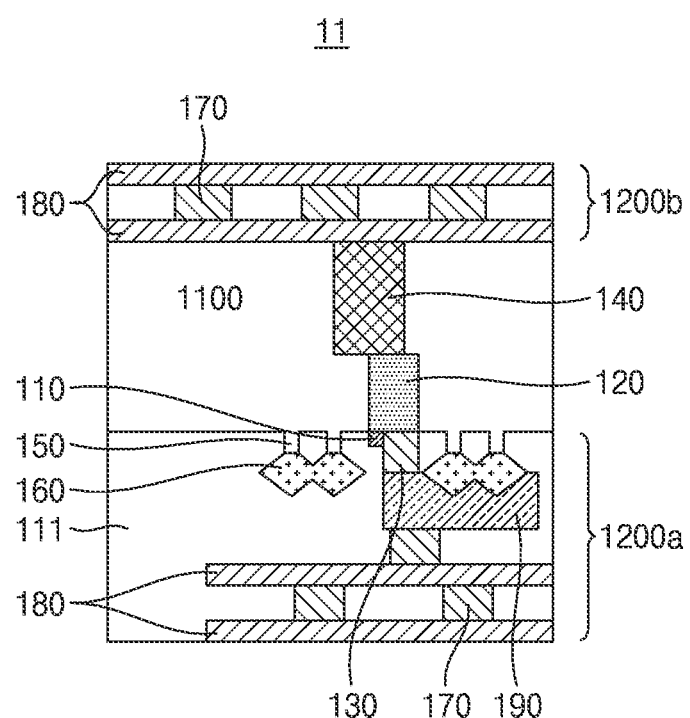
FIG. 2 illustrates a BSPDN semiconductor architecture according to a related art.

FIG. 2 illustrates a BSPDN semiconductor architecture according to a related art.

Referring the FIG. 2, the BSPDN semiconductor architecture 11 includes a wafer 1100, a first semiconductor device 1200a provided on a first surface of the wafer 1100, and a second semiconductor device 1200b provided on a second surface of the wafer 1100 opposite to the first surface. The first semiconductor device 1200a may be an integrated circuit configured to operate as a memory and/or operate as a part of a logic gate. The first semiconductor device 1200a includes components such as, for example, active transistors including epitaxial layers 160, signal wires 180, vias 170, vertical contacts 130, epitaxial contacts 190, etc. A portion of the BPR capping layer 110 may remain adjacent to the vertical contact 130. However, embodiments are not limited thereto.

The active transistors may include a power tapping epitaxial layer and a non-power tapping epitaxial layer. The signal wires 180 included in the first semiconductor device 1200a are connected to the non-power tapping epitaxial layer of the active transistors to route signals between the active transistors. The BPRs 120 are connected to the power tapping epitaxial layer of the active transistors and are not connected to the signal wires 180 included in the first semiconductor device 1200a. The BPRs 120 are respectively configured to deliver power to the active transistors.

The second semiconductor device 1200b may be a PDN integrated circuit. A TSV 140 configured as a power connecting structure may protrude from the second semiconductor device 1200b to be connected to a BPR 120.

As illustrated in FIG. 2, the BPR 120 protruding from the first semiconductor device 1200a and the TSV 140 protruding from the second semiconductor device 1200b may be misaligned with each other. In addition, an interface may be formed between the BPR 120 and the TSV 140. The misalignment and interface formed between the BPR 120 and the TSV 140 may increase the resistance of the BSPDN semiconductor architecture 11 and may lead to a device failure or degradation in performance of the BSPDN semiconductor architecture 11.

In addition, as the BPR 120 is formed prior to forming an FEOL layer of the first semiconductor device 1200a, therefore the BPR 120 may be thermally degraded when forming the FEOL layer, which may lead to a degradation or device failure of the BSPDN semiconductor architecture 11.

FIGS. 3A through 3M illustrate a method of manufacturing a BSPDN semiconductor architecture according to a related art.

Figure 3A:
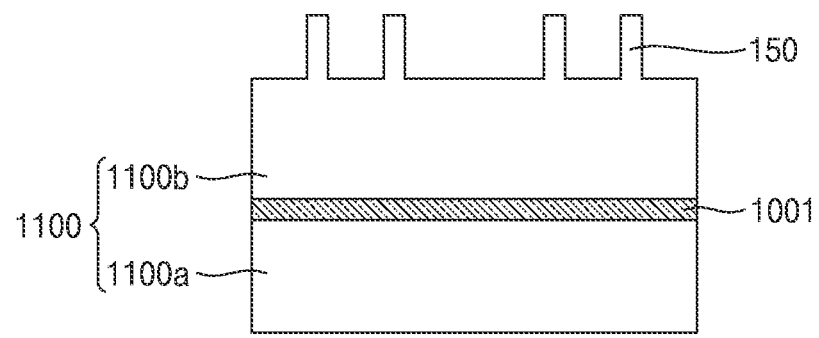
FIGS. 3A, 3B, 3C, 3D, 3E, 3F, 3G, 3H, 3I, 3J, 3K, 3L, and 3M illustrate a method of manufacturing a BSPDN semiconductor architecture according to a related art.

As illustrated in FIG. 3A, the method includes providing a wafer 1100 including a sacrificial layer 1100a, an etch stop layer 1001, and a carrier substrate 1100b, and patterning fins 150 on the carrier substrate 1100b. The sacrificial layer 1100a may be a silicon (Si) bulk layer, and the carrier substrate 1100b may be a Si layer. The etch stop layer 1001 may be provided between the sacrificial layer 1100a and the carrier substrate 1100b and may include, for example, silicon nitride (SiN) or silicon germanium (SiGe). However, embodiments are not limited thereto. The fins 150 include, for example, Si, and form respective channel structures of FinFETs, not being limited thereto. It is understood that the transistor described herebelow may be one or a combination of a FinFET, a nanowire transistor, a nanosheet transistor, etc.

Figure 3B:
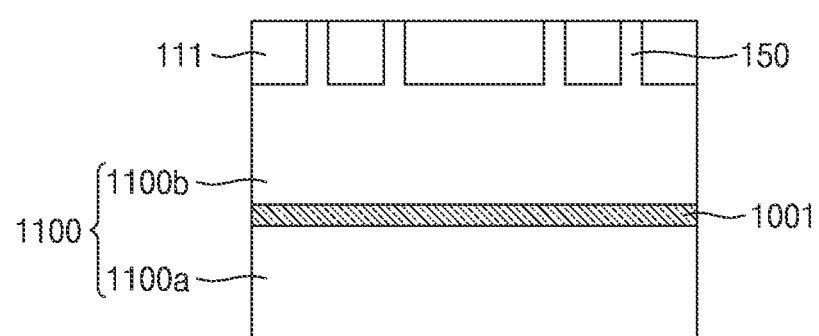

Referring to FIG. 3B, the method includes forming an oxide layer 111 on the carrier substrate 1100b.

Figure 3C:
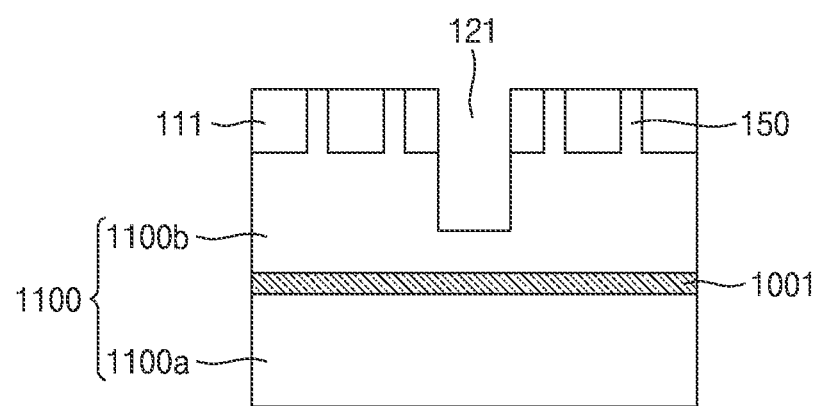
Figure 3D:
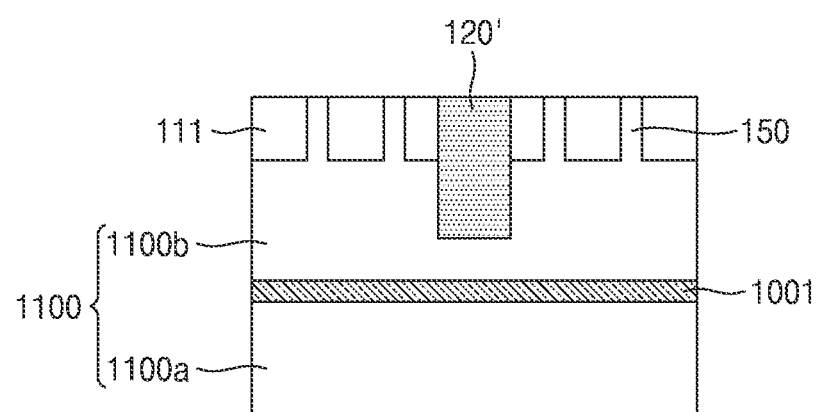

As illustrated in FIG. 3C, a trench 121 is formed in the oxide layer 111 and the carrier substrate 1100b to a level below the fins 150 in a vertical direction. Referring to FIG. 3D, the trench 121 is filled with a metal material 120' such as, for example, cobalt (Co), tungsten (W), and ruthenium (Ru).

Figure 3E:
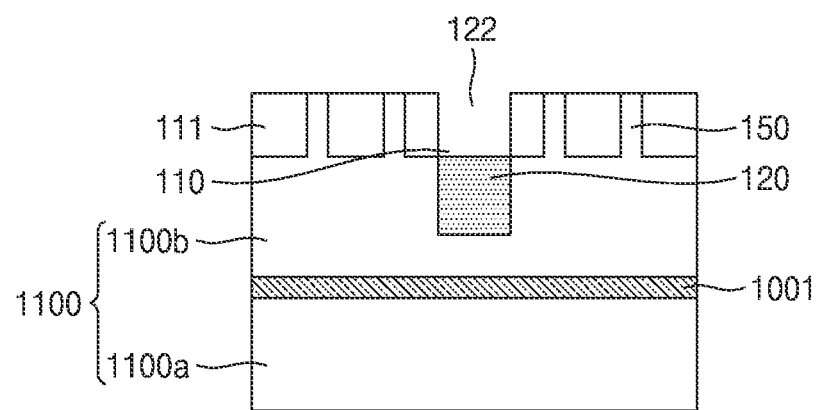
Figure 3F:
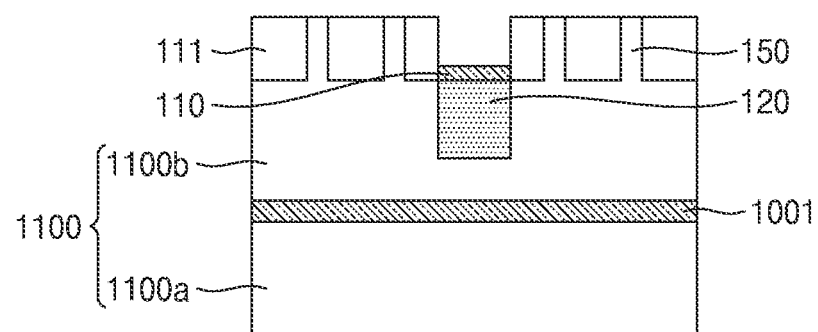
Figure 3G:
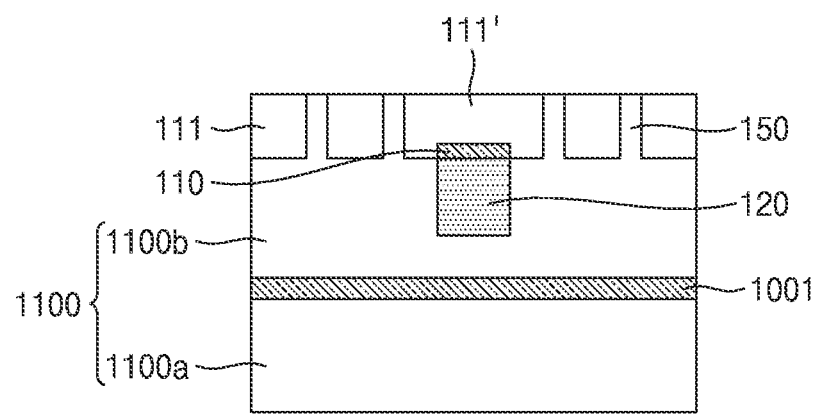

As illustrated in FIGS. 3E to 3G, the metal material 120' is etched to a level of a first surface of the carrier substrate 1100b to form a BPR 120. A BPR capping layer 110 is formed on the exposed surface of the BPR 120 to insulate the BPR 120. The BPR capping layer 110 includes, for example, silicon nitride (SiN). The space formed by etching the BPR 120 above the BPR capping layer 110 is filled with oxide material 111'. The oxide layer 111 and the oxide material 111' may be integrally formed.

Figure 3H:
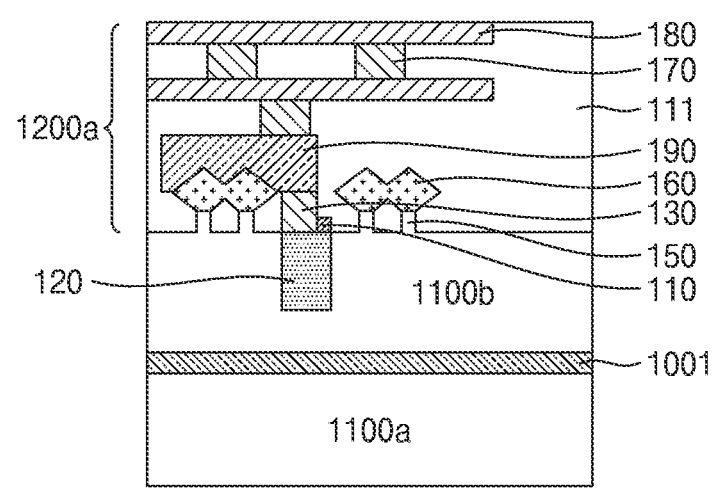

Referring to FIG. 3H, a first semiconductor device 1200a may be formed on a first surface of the wafer 1100. Forming the first semiconductor device 1200a includes forming an FEOL layer including epitaxial layers 160 that are formed on fins 150. The fins 150 may be respective channel structures of transistors such as FinFETs, not being limited thereto. An middle-of-line (MOL) layer is formed on the FEOL layer. The MOL layer includes an epitaxial contact 190 that contacts the epitaxial layers 160 and extends in a horizontal direction, and a vertical contact 130 that contacts the epitaxial contact 190 and the BPR 120. A back-end-of-line (BEOL) layer is formed on the MOL layer. The BEOL layer includes metal layers 180 and vias 170 formed between the metal layers 180 to interconnect the metal layers 180. Another via 170 may be also formed between the epitaxial contact 190 and a metal layer 180 to connect the epitaxial layers 160 to the metal layer 180. An oxide layer 111 is formed on the first surface of the wafer 1100 and adjacent to the FEOL layer, the MOL layer, and the BEOL layer to a level of the BEOL layer in a vertical direction.

Figure 3I:
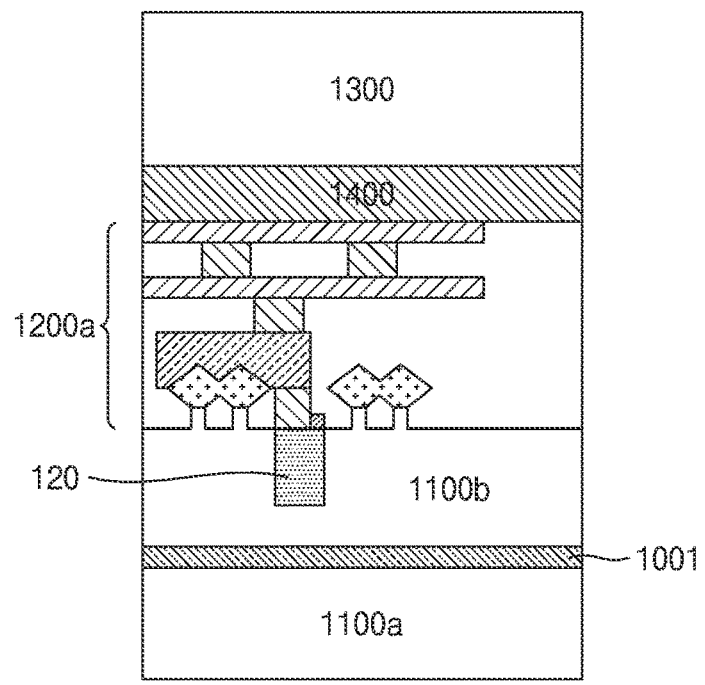
Figure 3J:
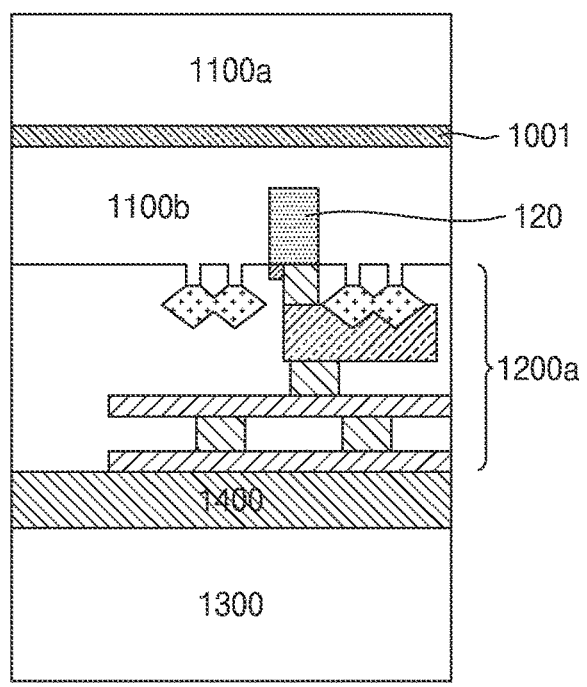

Referring to FIG. 3I, a wafer-to-wafer bonding process is performed. For example, a second wafer 1300 is provided on a first surface of the first semiconductor device 1200a. The second wafer 1300 may be bonded by an adhesive layer 1400 provided between the first semiconductor device 1200a and the second wafer 1300. The semiconductor architecture is flipped as illustrated in FIG. 3J.

Figure 3K:
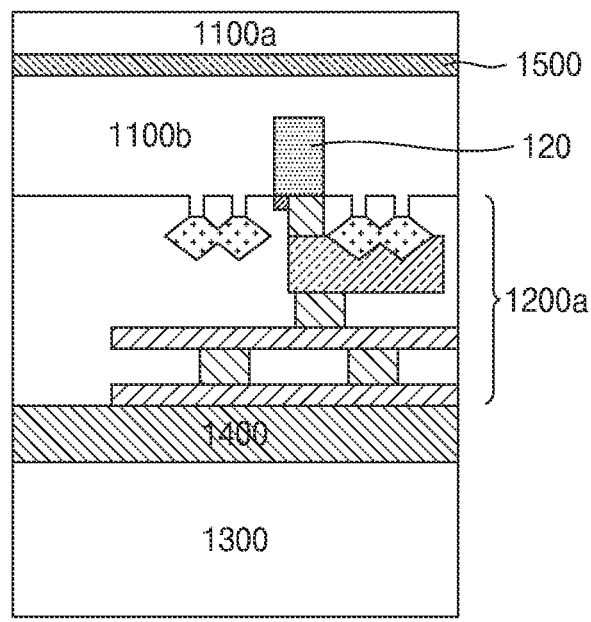
Figure 3L:
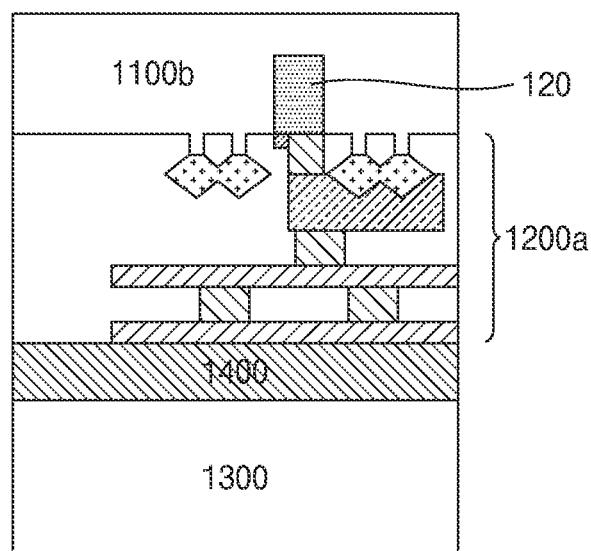

Referring to FIG. 3K and 3L, the sacrificial layer 1100a is removed and the etch stop layer 1001 is removed to expose a second surface of the carrier substrate 1100b.

Figure 3M:
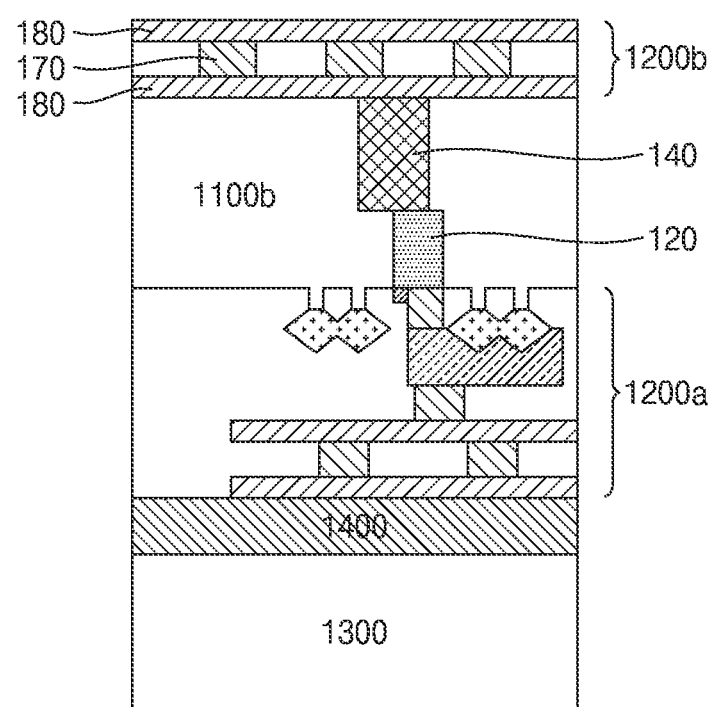

Referring to FIG. 3M, a second semiconductor device 1200b is formed on the exposed second surface of the carrier substrate 1100b. Forming the second semiconductor device 1200b includes forming metal lines 180 on the second surface of the carrier substrate 1100b and vias 170 between the metal lines 180. The metal lines 180 and vias 70 form a PDN configured to deliver power. A TSV 140 is formed to protrude from a first surface of the metal layer 180 provided on the second surface of the carrier substrate 1100b and penetrates the carrier substrate 1100b. The second semiconductor device 1200b is provided on the second surface of the carrier substrate 1100b based on a location of the BPR 120 included in the first semiconductor device 1200a such that the TSV 140 is connected to the BPR 120.

As illustrated in FIG. 3G, as the TSV 140 is formed separately from the BPR 120, an interface is formed between the TSV 140 and the BPR 120 which may increase a resistance of the BSPDN semiconductor architecture 11 and reduce the performance of the BSPDN semiconductor architecture 11.

In addition, as the BPR 120 is formed prior to forming the FEOL layer of the first semiconductor device 1200a, the BPR 120 may be thermally degraded when the FEOL layer is formed, which may lead to a degradation or device failure of the BSPDN semiconductor architecture 11.

Figure 4:
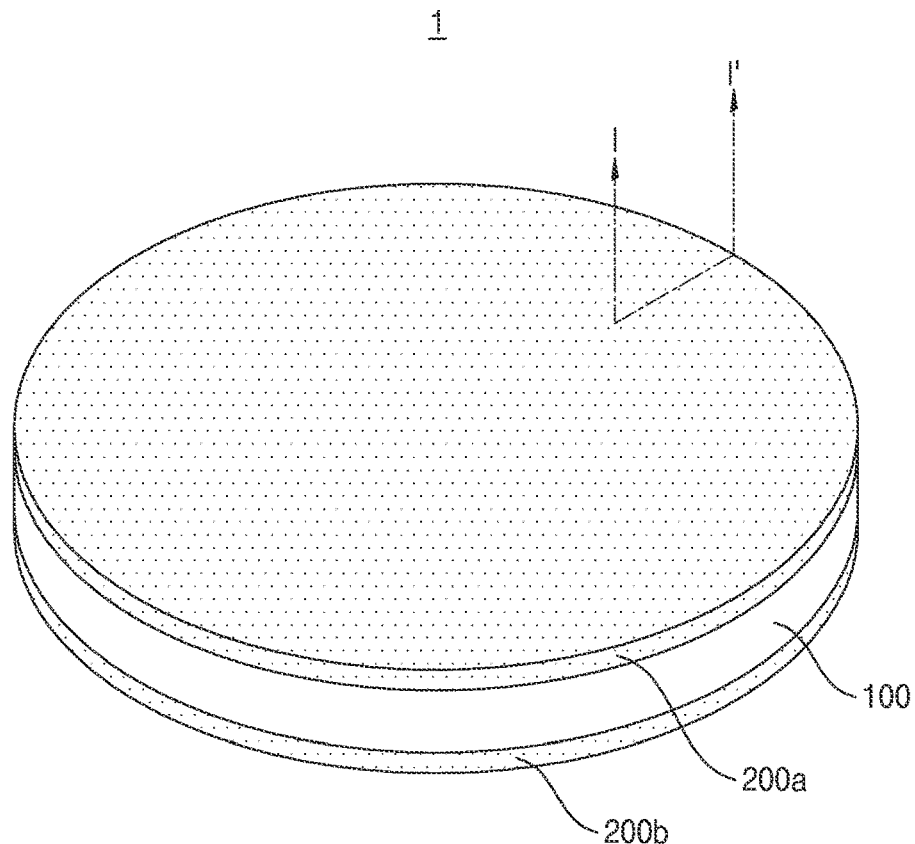
FIG. 4 illustrates a perspective view of a BSPDN semiconductor architecture according to an example embodiment.

FIG. 4 illustrates a perspective view of a BSPDN semiconductor architecture according to an example embodiment.

As illustrated in FIG. 4, the BSPDN semiconductor architecture 1 includes a wafer 100, a first semiconductor device 200a provided on a first surface of the wafer 100, and a second semiconductor device 200b provided on a second surface of the wafer 100 opposite to the first semiconductor device 200a. The first semiconductor device 200a and the second semiconductor device 200b are integrated to each other and form a BSPDN semiconductor architecture 1.

The wafer 100 includes, for example, a Si substrate, a glass substrate, a sapphire substrate, etc. However, embodiments are not limited thereto. As illustrated in FIG. 4, the wafer 100 may be a circular panel, but the shape of the wafer 100 is not limited thereto. For example, the wafer 100 may be a tetragonal panel. The wafer 100 may include a single layer or multiple layers.

Figure 5:
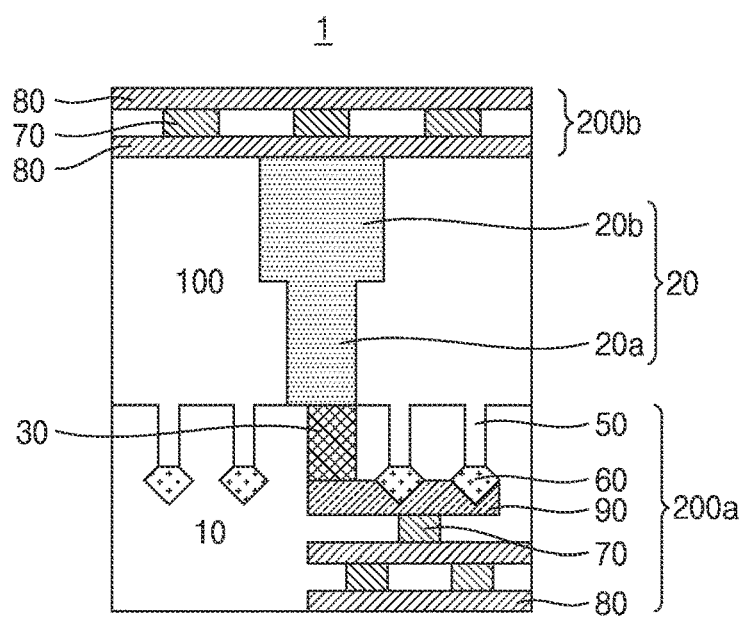
FIG. 5 illustrates a cross-sectional view taken along line I-I' of FIG. 4 according to an example embodiment.

FIG. 5 illustrates a cross-sectional view taken along line I-I' of FIG. 4 according to an example embodiment.

As illustrated in FIG. 5, the BSPDN semiconductor architecture 1 includes a wafer 100, fins 50 patterned on a first side of the wafer 100, and an oxide layer 10 deposited on the wafer 100. The wafer 100 and the fins 50 include, for example, Si. The fins 50 may be respective channel structures of transistors such as FinFETs, not being limited thereto. The transistor may be one or a combination of a FinFET, a nanowire transistor, a nanosheet transistor, etc.

The BSPDN semiconductor architecture 1 also includes a first semiconductor device 200a formed on the first side of the wafer 100. The first semiconductor device 200a may be an integrated circuit including transistor devices. The first semiconductor device 200a includes an FEOL layer including epitaxial layers 60 grown on the fins 50. The epitaxial layers 60 may form active regions, i.e., source/drain regions, of the transistors, and may include, for example, Si. The first semiconductor device 200a also includes an MOL layer including an epitaxial contact 90 that contacts the epitaxial layers 60, and extends in a horizontal direction parallel to the first surface of the wafer 100. The MOL layer also includes a vertical contact 30 that contacts the epitaxial contact 90 and extends to a first surface of the wafer 100 in the vertical direction. The first semiconductor device 200a also includes a BEOL layer including metal layers 80 configured to route signals, and vias 70 formed between the metal layers 80 to interconnect the metal layers 80. A via 70 is also formed between the metal layer 80 and the epitaxial contact 90 to connect the metal layers 80 to the epitaxial layer 60. The metal layers 80 included in the first semiconductor device 200a are connected to non-power tapping epitaxial layers 60.

A BPR 20 is formed to contact the vertical contact 30 and penetrate inside of the wafer 100 to extend to a level of a second surface of the wafer 100. The BPR 20 includes a first BPR portion 20a provided from the first surface of the wafer 100 and a second BPR portion 20b provided from a second surface of the wafer 100. A width of the first BPR portion 20a is different from a width of the second BPR portion 20b in a horizontal direction. For example, a width of the first BPR portion 20a is less than a width of the second BPR portion 20b. The width of the first BPR portion 20a may be greater than a width of the vertical contact 30, but embodiments are not limited thereto. The BPR 20 is included inside of the wafer 100, and is configured to deliver power.

The BSPDN semiconductor architecture 1 also includes a second semiconductor device 200b formed on the second surface of the wafer 100. The second semiconductor device 200b may be an integrated circuit including a PDN. The second semiconductor device 200b includes metal layers 80 formed on the second surface of the wafer 100 and vias 70 provided between metal layers 80. The metal layers 80 and vias 70 form a PDN configured to deliver power. A metal layer 80 is formed on the second surface of the wafer 100 to directly contact the second BPR portion 20b.

The BSPDN semiconductor architecture 1 according to the example embodiment does not include a separate TSV, and the BPR 20 extends from the first surface of the wafer 100 to the second surface of the wafer 100 to connect the first semiconductor device 200a with the second semiconductor device 200b. Accordingly, concern for a misalignment between the first semiconductor device 200a and the second semiconductor device 200b may be reduced and no interface is formed in the single BPR 20 which extends from the first semiconductor device 200a to the second semiconductor device 200b. Accordingly, the resistance of the BSPDN semiconductor architecture 1 may be lowered and the performance of the BSPDN semiconductor architecture 1 may be improved.

In addition, the BPR 20 included in the BSPDN semiconductor architecture 1 according to the example embodiment may not be thermally degraded or the thermal degradation may be reduced compared to the BPR 120 included in the BSPDN semiconductor architecture 11 as illustrated in FIG. 2. Accordingly, degradation of the BSPDN semiconductor architecture 1 may be reduced and a failure of the BSPDN semiconductor architecture 1 may be prevented.

FIGS. 6A through 6L illustrate a method of manufacturing a semiconductor architecture in FIG. 5 according to an example embodiment.

Figure 6A:
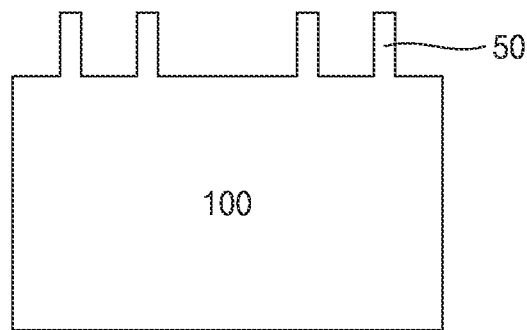
FIGS. 6A, 6B, 6C, 6D, 6E, 6F, 6G, 6H, 6I, 6J, 6K, and 6L illustrate a method of manufacturing a BSPDN semiconductor architecture according to an example embodiment.
Figure 6B:
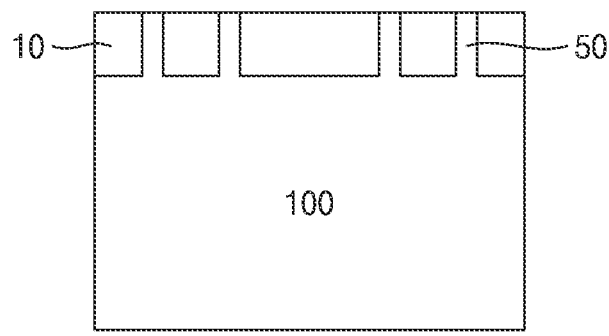

As illustrated in FIG. 6A, the method includes providing a wafer 100 and patterning fins 50 on the wafer 100. The wafer 100 and the fins 50 may include, for example, Si. Each of the fins 50 may be used as a current channel of a transistor. Although each of the fins 50 is illustrated as a fin structure of a FinFET in FIGS. 6A through 6L, the fin 50 may be a combination of multiple fin structures such as nanowires or nanosheets for a nanowire transistor or a nanosheet transistor, respectively. As illustrated in FIG. 6B, an oxide layer 10 formed of, for example, silicon oxide ($SiO_2$), is deposited on the wafer 100. However, embodiments are not limited thereto, and the oxide layer 10 may include other oxide materials.

Figure 6C:
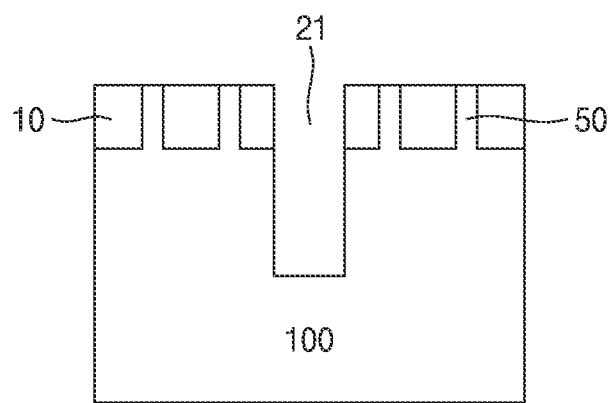
Figure 6D:
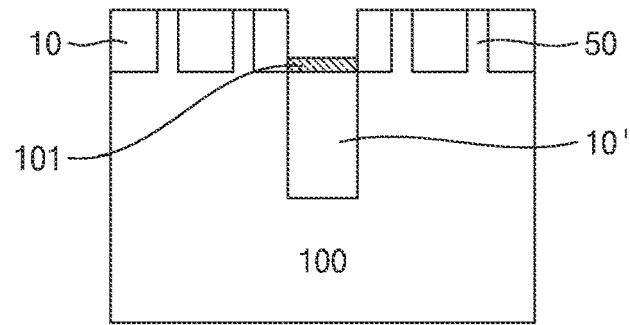
Figure 6E:
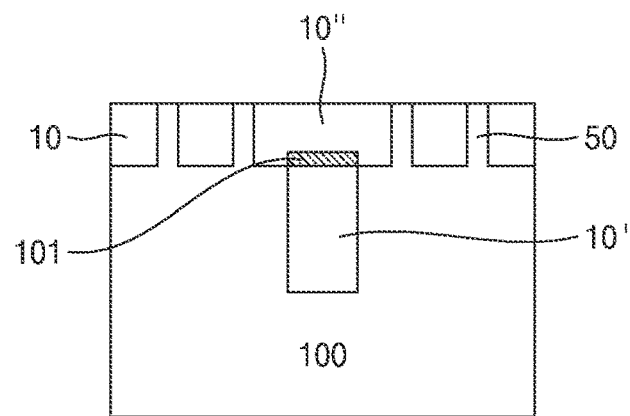

As illustrated in FIG. 6C, a first trench 21 is formed in the wafer 100 and the oxide layer 10. The first trench 21 extends in the wafer 100 to a level below the fins 50 in a vertical direction. As illustrated in FIG. 6D, the first trench 21 is filled with oxide fill material 10' to a level of the first surface of the wafer 100. The oxide fill material 10' may include, for example, $SiO_2$, but is not limited thereto and may include other oxide materials. An etch stop layer 101 is formed on an exposed surface of the oxide fill material 10'. The etch stop layer 101 includes, for example, SiN or SiGe. As illustrated in FIG. 6E, a remaining space of the first trench 21 above the etch stop layer 101 is filled with oxide material 10". The oxide material 10" filled above the etch stop layer 101 may be integrally formed with the oxide layer 10.

Figure 6F:
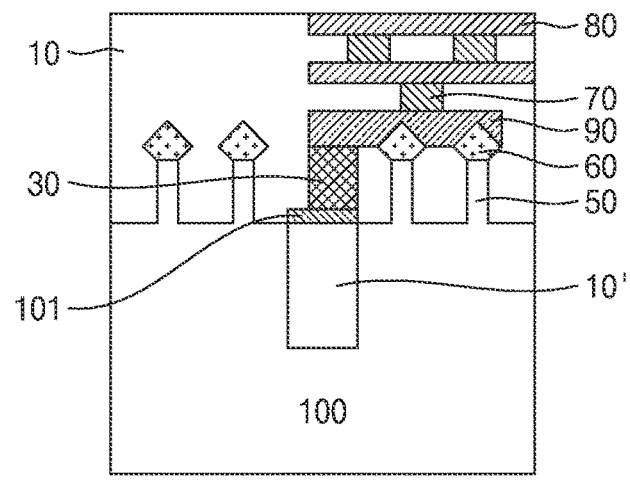

As illustrated in FIG. 6F, a first semiconductor device 200a is formed. An FEOL layer including epitaxial layers 60 grown on the fins 50 is formed. The epitaxial layers 60 may form active regions, i.e., source/drain regions, of the transistors, and may include, for example, Si. An MOL layer is formed on the FEOL layer. The MOL layer includes an epitaxial contact 90 that contacts the epitaxial layer 60 and extends in a horizontal direction parallel to a first surface of the wafer 100. Forming the MOL layer also includes forming a vertical contact 30 that contacts the epitaxial contact 90 and penetrates the oxide layer 10 toward the first surface of the wafer 100 to contact the etch stop layer 101. A BEOL layer is formed on the MOL layer. The BEOL layer includes metal layers 80 and vias 70 formed between the metal layers 80 to interconnect the metal layers 80, and a via 70 formed between the metal layer 80 and the epitaxial contact 90. Oxide material that is integrally formed with the oxide layer 10 may be deposited adjacent to the FEOL layer, the MOL layer, and the BEOL layer to a level of the BEOL layer in a vertical direction.

Figure 6G:
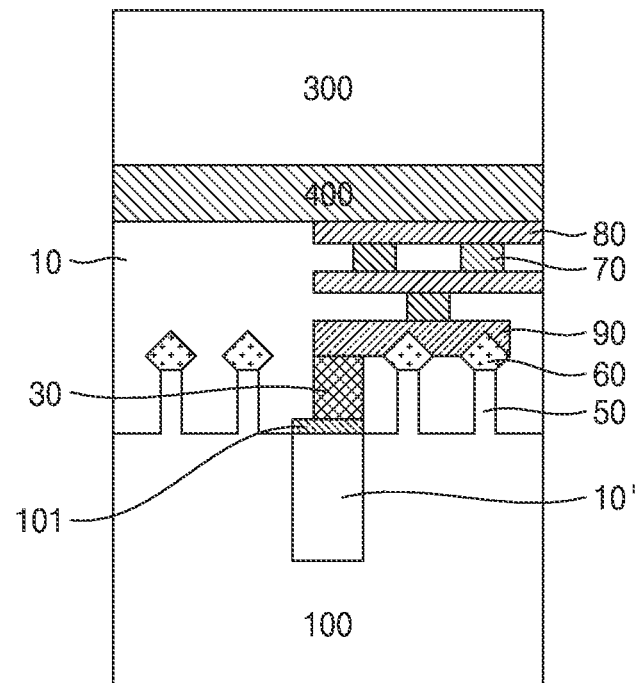

Referring to FIG. 6G, a wafer-to-wafer bonding process is performed. For example, a second wafer 300 is provided on a first surface of the first semiconductor device 200a. The second wafer 300 is bonded to the first semiconductor device 200a by providing an adhesive layer 400 between the first semiconductor device 200a and the second wafer 300. However, embodiments are not limited thereto. According to another example embodiment, the second wafer 300 may be directly provided on the first semiconductor device 200a.

Figure 6H:
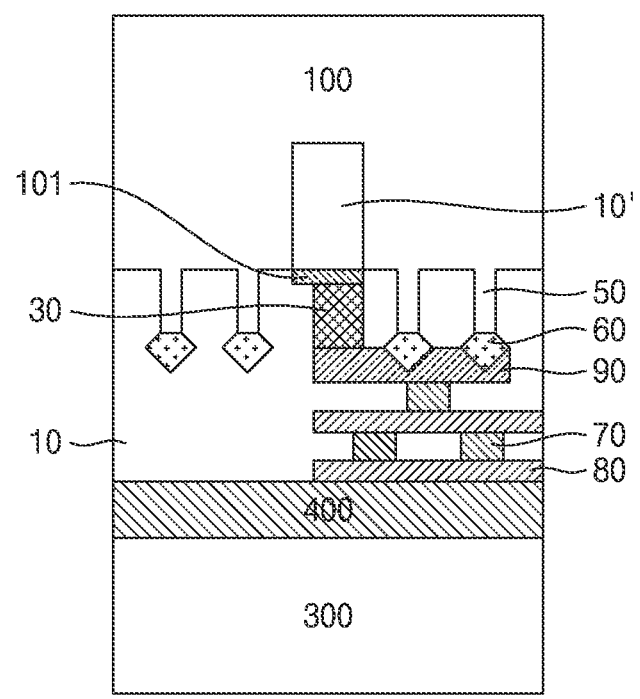

For example, the second wafer 300 may be directly bonded to the first semiconductor device 200a by a Si direct bonding without using an adhesive layer. The semiconductor architecture is flipped as illustrated in FIG. 6H.

Figure 6I:
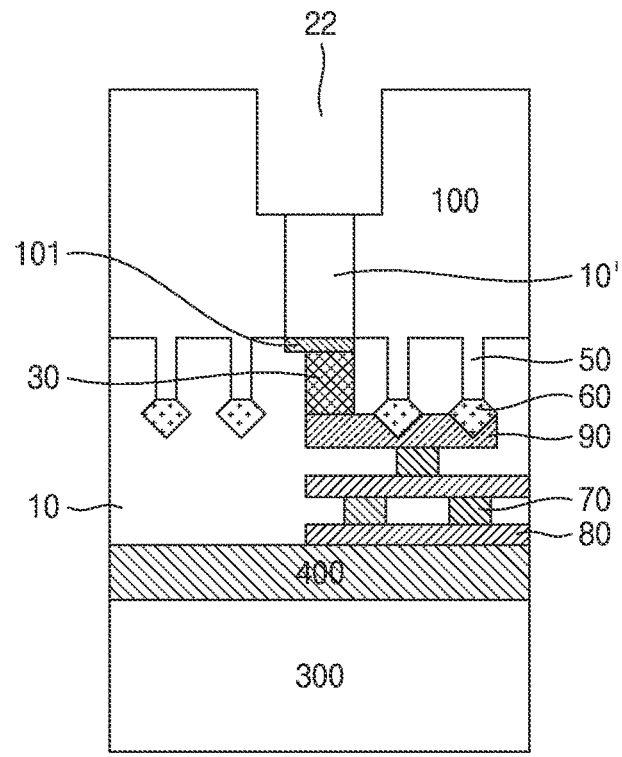
Figure 6J:
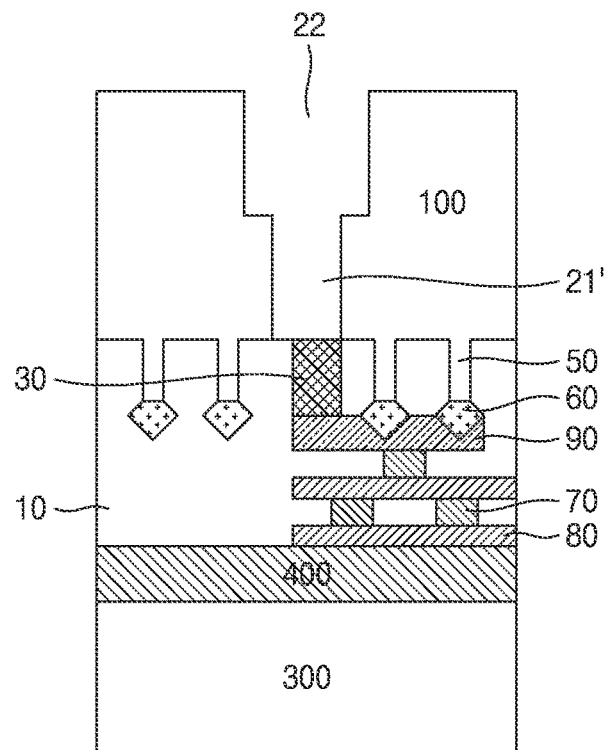

As illustrated in FIG. 6I, a second trench 22 is etched from a second surface of the wafer 100 to expose the oxide fill material 10'. As illustrated in FIG. 6I, a width of the second trench 22 is greater than a width of the first trench 21 which is filled with the oxide fill material 10'. Referring to FIG. 6J, the oxide fill material 10' and the etch stop layer 101 is removed to form a space in the first trench 21' and expose the vertical contact 30.

Figure 6K:
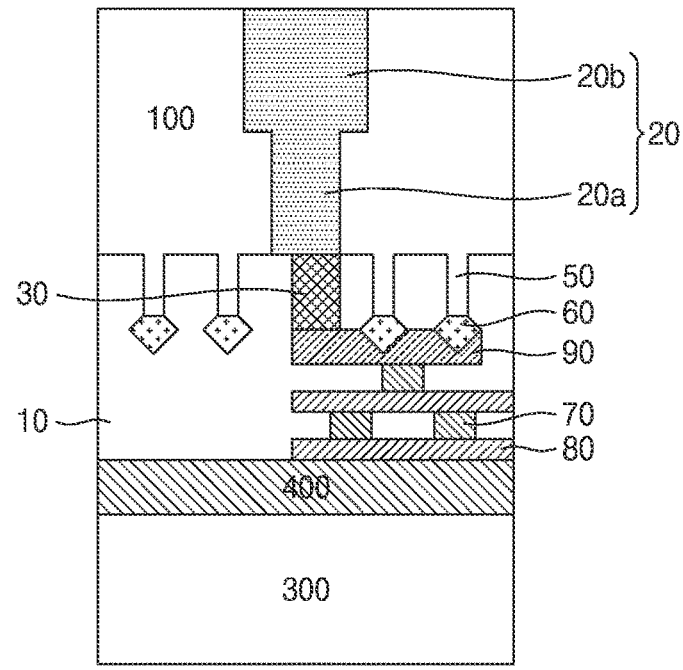

As illustrated in FIG. 6K, a metal material such as, for example, copper (Cu), cobalt (Co), tungsten (W), ruthenium (Ru), etc., is filled in the second trench 22 and the space in the first trench 21' to form a BPR 20 including a first BPR portion 20a and a second BPR portion 20b. The first BPR portion 20a is formed to contact the vertical contact 30. A width of the first BPR portion 20a is less than a width of the second BPR portion 20b.

Figure 6L:
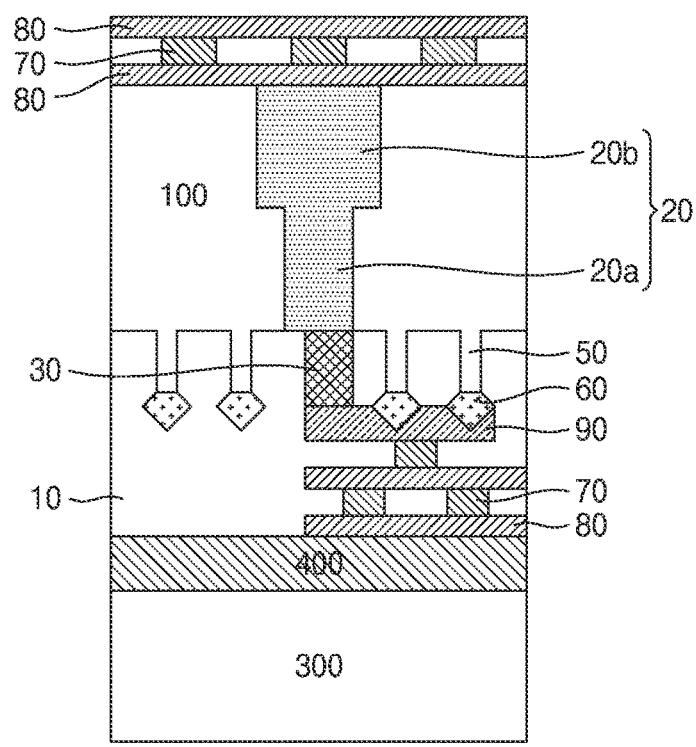

As illustrated in FIG. 6L, a second semiconductor device 200b is provided on the second surface of the wafer 100 and the second BPR portion 20b. The second semiconductor device 200b is provided to contact the second BPR portion 20b. Providing the second semiconductor device 200b includes providing metal layer 80 and vias 70 between the metal layers 80 to form a PDN configured to deliver power through the BPR 20.

The BSPDN semiconductor architecture 1 according to the example embodiment does not include a separate TSV, and a single BPR that is integrally formed extends from the first surface of the wafer 100 to the second surface of the wafer 100 to connect the first semiconductor device 200a with the second semiconductor device 200b. Accordingly, concern for a misalignment between the first semiconductor device 200a and the second semiconductor device 200b may be reduced and no interface is formed in the single BPR, which may lower the resistance and improve the performance of the BSPDN semiconductor architecture 1. In addition, the manufacturing process of the BSPDN semiconductor architecture 1 may be more simplified.

According to the example embodiment, the BPR 20 included in the BSPDN semiconductor architecture 1 is formed after forming the FEOL layer that requires high temperature. Accordingly, the thermal degradation of the BPR 20 may be reduced or prevented. In addition, a metal material such as Cu which has a relatively low resistance may be used to form the BPR 20.

FIGS. 7A through 7E illustrate a method of forming the etch stop layer in the BSPDN semiconductor architecture as illustrated in FIG. 6D according to an example embodiment.

Figure 7A:
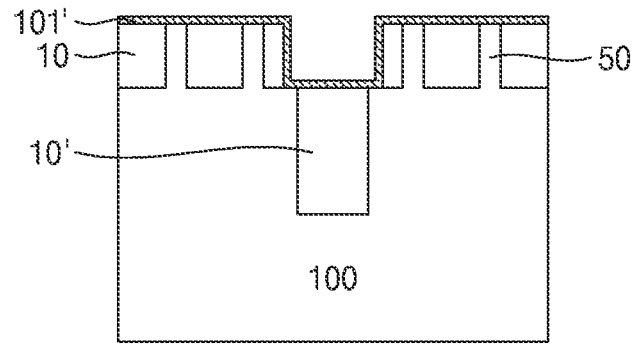
FIGS. 7A, 7B, 7C, 7D, and 7E illustrate a method of forming an etch stop layer in a BSPDN semiconductor architecture according to an example embodiment.

Referring to FIG. 7A, a SiN layer 101' is deposited on the oxide layer 10 filled to a level of the first surface of the wafer 100 in the trench 21 etched as illustrated in FIG. 6C, the fins 50, and a remaining space of the first trench 21 formed above the oxide fill material 10'. The SiN layer 101' may be deposited on a bottom surface and side surfaces of the remaining space of the first trench 21.

Figure 7B:
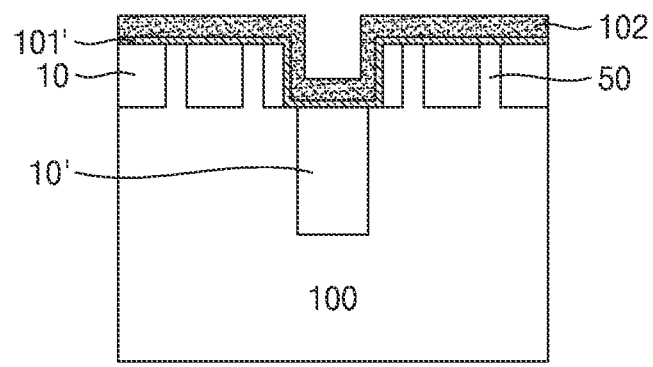
Figure 7C:
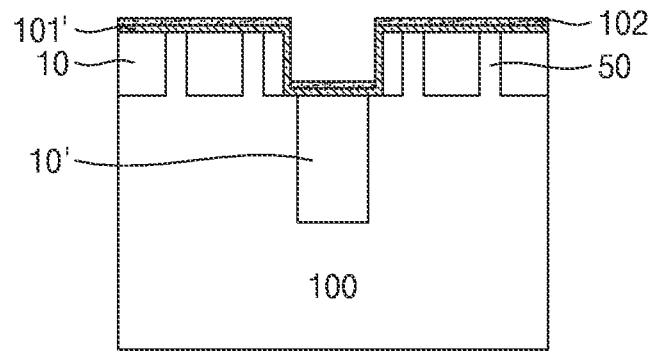

As illustrated in FIG. 7B, a chemical vapor deposition (CVD) oxide layer 102 is deposited on an entire surface of the SiN layer 101'. The CVD oxide layer 102 may include an oxide material. The CVD oxide layer 102 may have a non-uniform coverage on upper surfaces extending in a horizontal direction compared to side surfaces extending in a vertical direction. For example, the CVD oxide layer 102 provided on the upper surfaces may be thicker than the CVD oxide layer 102 provided on the side surfaces. As illustrated in FIG. 7C, a portion of the CVD oxide layer 102 provided on the SiN layer 101' is removed by, for example, wet etching. Due to the non-uniform coverage of the CVD oxide layer 102, a portion of the CVD oxide layer 102 deposited on an upper surface of the SiN layer 101' may be removed and an entire portion of the CVD oxide layer 102 formed on side surfaces of the SiN layer 101' deposited one the side surfaces of the remaining space of the first trench 21 may be removed by, for example, wet etching.

Figure 7D:
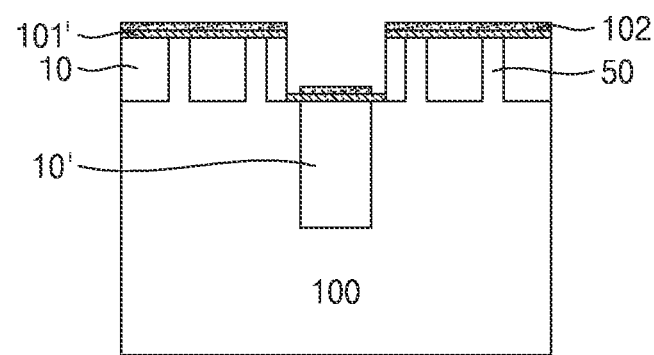

Referring to FIG. 7D, the SiN layer 101' formed on the side surfaces of the first trench 21 is entirely removed by, for example, wet etching to expose the oxide layer 10.

Figure 7E:
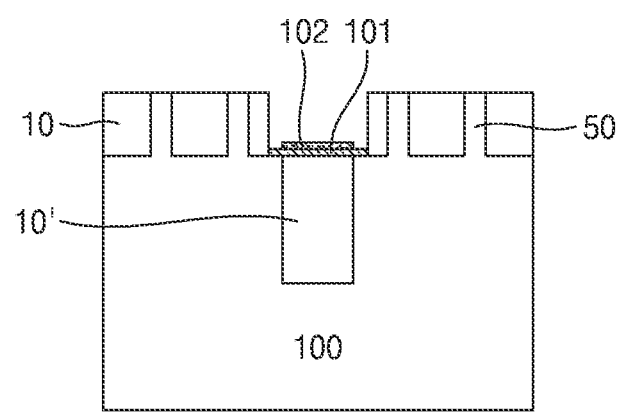

Referring the FIG. 7E, the CVD oxide layer 102 and the SiN layer 101' formed on the fins 50 and oxide layer 10 are entirely removed by patterning, and a portion of the etch stop layer 101 and CVD oxide layer 102 remaining on the exposed surface of the oxide fill material 10' forms the etch stop layer 101.

Figure 8A:
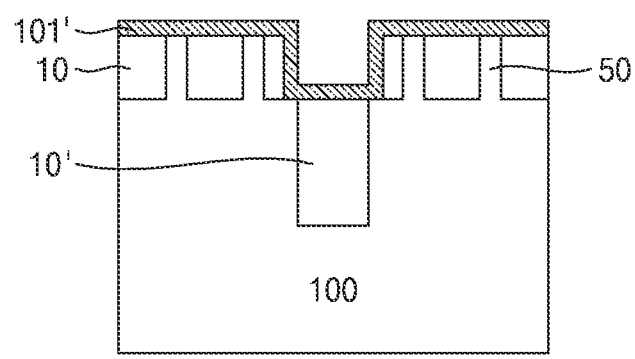
FIGS. 8A and 8B illustrate a method of forming an etch stop layer in a BSPDN semiconductor architecture according to another example embodiment.
Figure 8B:
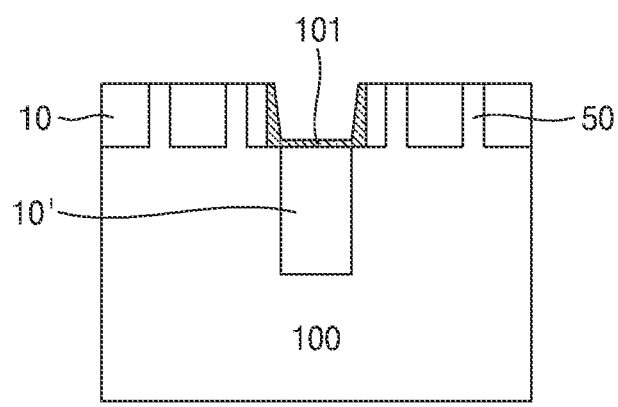

FIGS. 8A and 8B illustrate a method of providing the etch stop layer in the BSPDN semiconductor architecture as illustrated in FIG. 6D according to another example embodiment.

As illustrated in FIG. 8A, an SiN layer 101' is deposited on the oxide layer 10, the fins 50, and a remaining space of the first trench 21 formed above the oxide fill material 10'. The SiN layer 101' is deposited on a bottom surface and side surfaces of the remaining space of the first trench 21.

As illustrated in FIG. 8B, the SiN layer 101' formed on the oxide layer 10 and the fins 50 is entirely removed by patterning, and a portion of the SiN layer 101' formed on side surfaces of the first trench 21 may be removed during the patterning process to form the etch stop layer 101. In this example, a portion of the SiN layer 101' may remain on the side surfaces of the remaining space of the first trench 21.

Figure 9A:
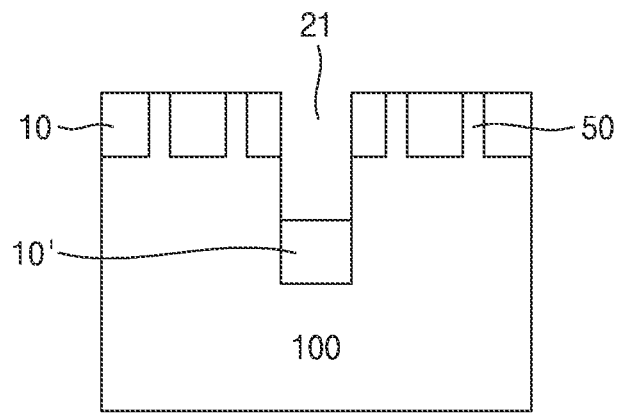
FIGS. 9A, 9B, and 9C illustrate a method of forming an etch stop layer in a BSPDN semiconductor architecture according to another example embodiment.
Figure 9B:
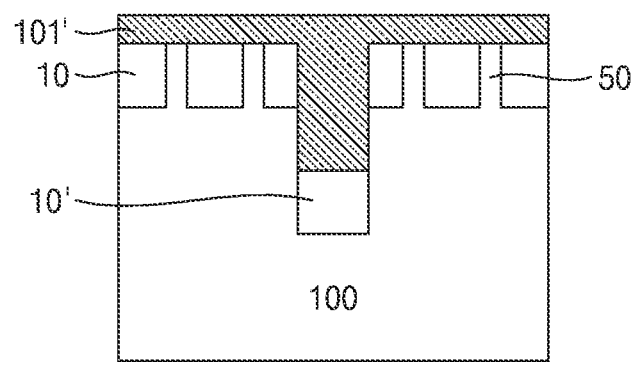
Figure 9C:
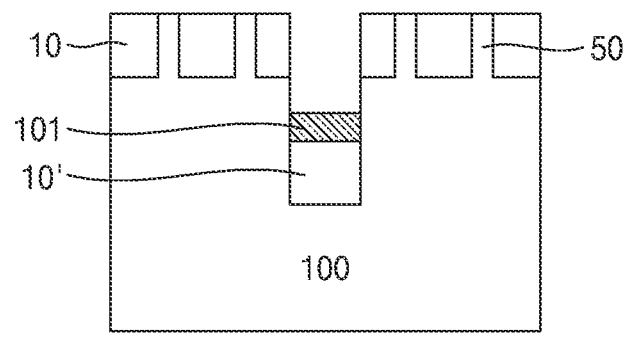

FIGS. 9A through 9C illustrate a method of providing the etch stop layer in the BSPDN semiconductor architecture as illustrated in FIG. 6D according to another example embodiment.

As illustrated in FIG. 9A, a portion of the oxide fill material 10' is etched to a level below the first surface of the wafer 100 in a vertical direction.

As illustrated in FIG. 9B, a SiN layer 101' is filled in a remaining space of the first trench 21 above the etched oxide fill material 10' and deposited on the fins 50 and the oxide layer 10.

As illustrated in FIG. 9C, the SiN layer 101' formed on the fins 50 and the oxide layer 10 is removed by, for example, wet etching, and a portion of the SiN layer 101' filled in the first trench 21 is removed to a level below the first surface of the wafer 100 in the vertical direction to form the etch stop layer 101.

Figure 10A:
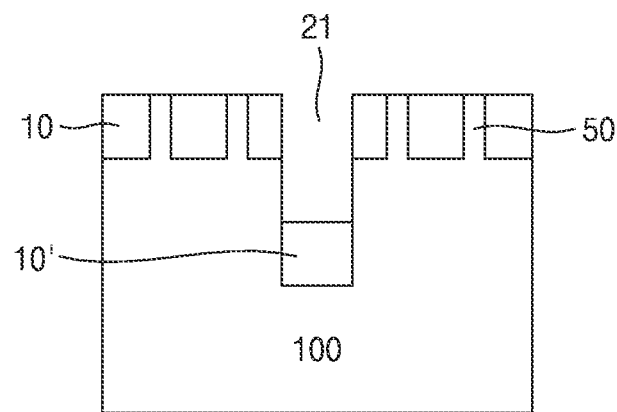
FIGS. 10A and 10B illustrate a method of forming an etch stop layer in a BSPDN semiconductor architecture according to another example embodiment.
Figure 10B:
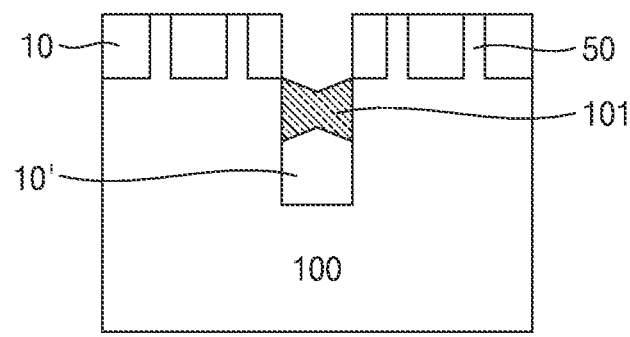

FIGS. 10A and 10B illustrate a method of providing the etch stop layer in the BSPDN semiconductor architecture according to another example embodiment.

As illustrated in FIG. 10A, a portion of the oxide fill material 10' is etched to a level below the first surface of the wafer 100 in a vertical direction.

A SiGe is grown from the side surfaces of the wafer 100 above the etched oxide fill material 10' and below the first surface of the wafer 100 to form an etch stop layer 101.

Figure 11:
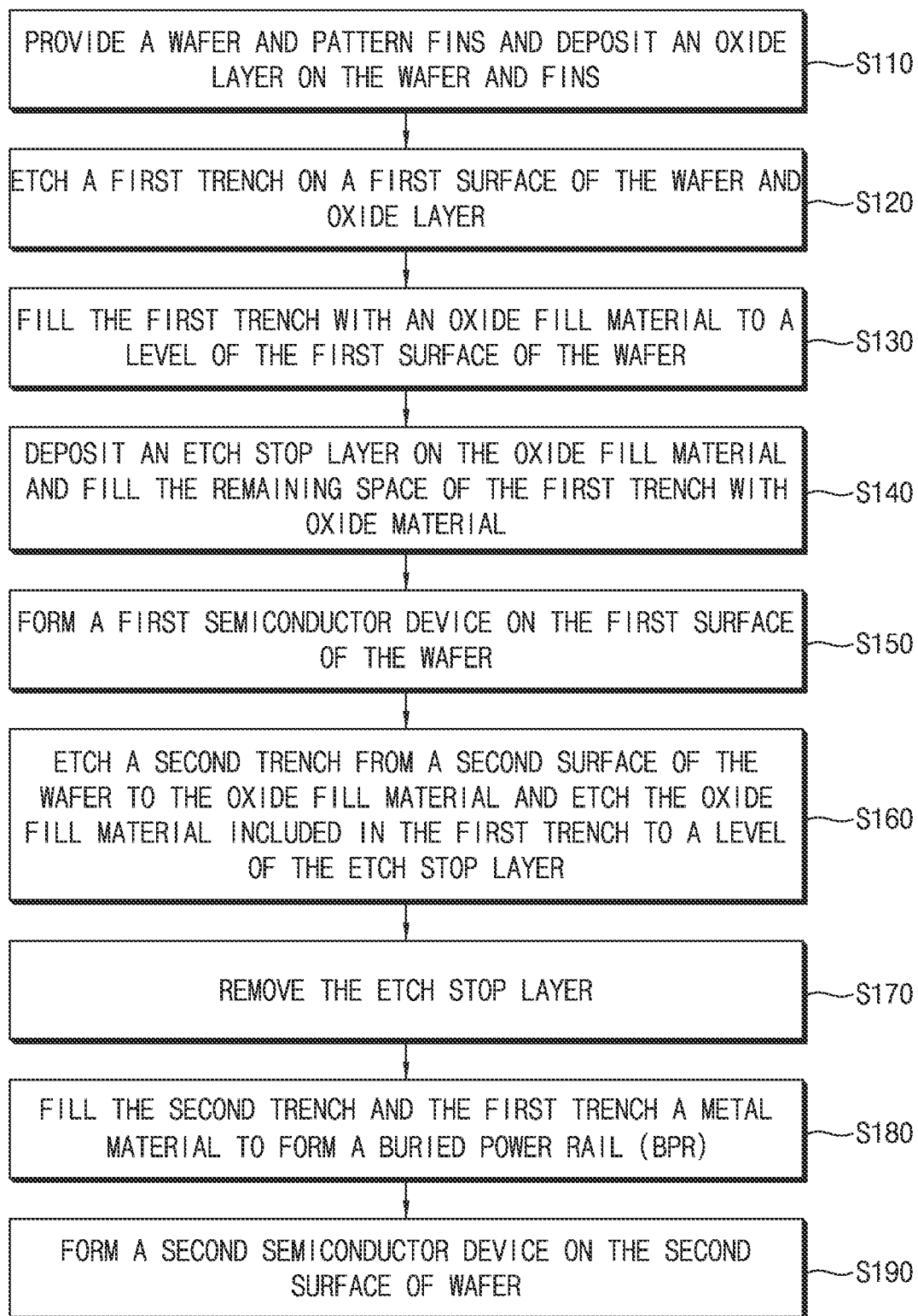
FIG. 11 illustrates a flowchart of a method of manufacturing a BSPDN semiconductor architecture according to an example embodiment.

FIG. 11 illustrates a flowchart of a method of manufacturing a BSPDN semiconductor architecture according to an example embodiment.

The method includes providing a wafer and patterning fins on the wafer, and depositing an oxide layer on the wafer and the fins (S110). The wafer and the fins may include, for example, Si. The fins may be channel structures of transistors such as FinFETs, but embodiments are not limited thereto.

A first trench is etched on a first surface of the wafer and the oxide layer (S120). The first trench extends in the wafer to a level below the fins. The first trench is filled with an oxide fill material to a level of the first surface of the wafer (S130). The oxide fill material may include, for example, SiO. An etch stop layer is deposited on the oxide fill material and a remaining space of the first trench above the etch stop layer is filled with an oxide material (S140). The etch stop layer 101 may include, for example, SiN or SiGe.

A first semiconductor device is formed on a first surface of the wafer (S150). An FEOL layer including epitaxial layers grown on the fins is formed. An MOL layer is formed on the FEOL layer. The MOL layer includes an epitaxial contact that contacts the epitaxial layer and extends in a horizontal direction parallel to a first surface of the wafer. Forming the MOL layer also includes forming a vertical contact that contacts the epitaxial contact and penetrates the oxide layer toward the first surface of the wafer to contact the etch stop layer. A BEOL layer is formed on the MOL layer. The BEOL layer includes metal layers and vias formed between the metal layers to interconnect the metal layers, and a via formed between the metal layer and the epitaxial contact. Oxide material that is integrally formed with the oxide layer may be deposited adjacent to the FEOL layer, the MOL layer, and the BEOL layer to a level of the BEOL layer in a vertical direction.

A second trench is etched on a second surface of the wafer to a level of the oxide fill material, and the oxide fill material included in the first trench is removed to a level of the etch stop layer (S160). A width of the second trench is greater than a width of the first trench. The etch stop layer is removed to expose the vertical contact (S170). The second trench and a space formed in the first trench is filled with a metal material to form a buried power rail (BPR) (S180). The metal material includes, for example, Cu, Co, W, Ru, etc.

A second semiconductor device is formed on a second surface of the wafer and the BPR (S190). Forming the second semiconductor device includes providing a PDN including metal layers and vias between the metal layers configured to supply power through the BPR. Vias are provided on the power rail metal layer and a metal layer is provided on the vias.

Figure 12:
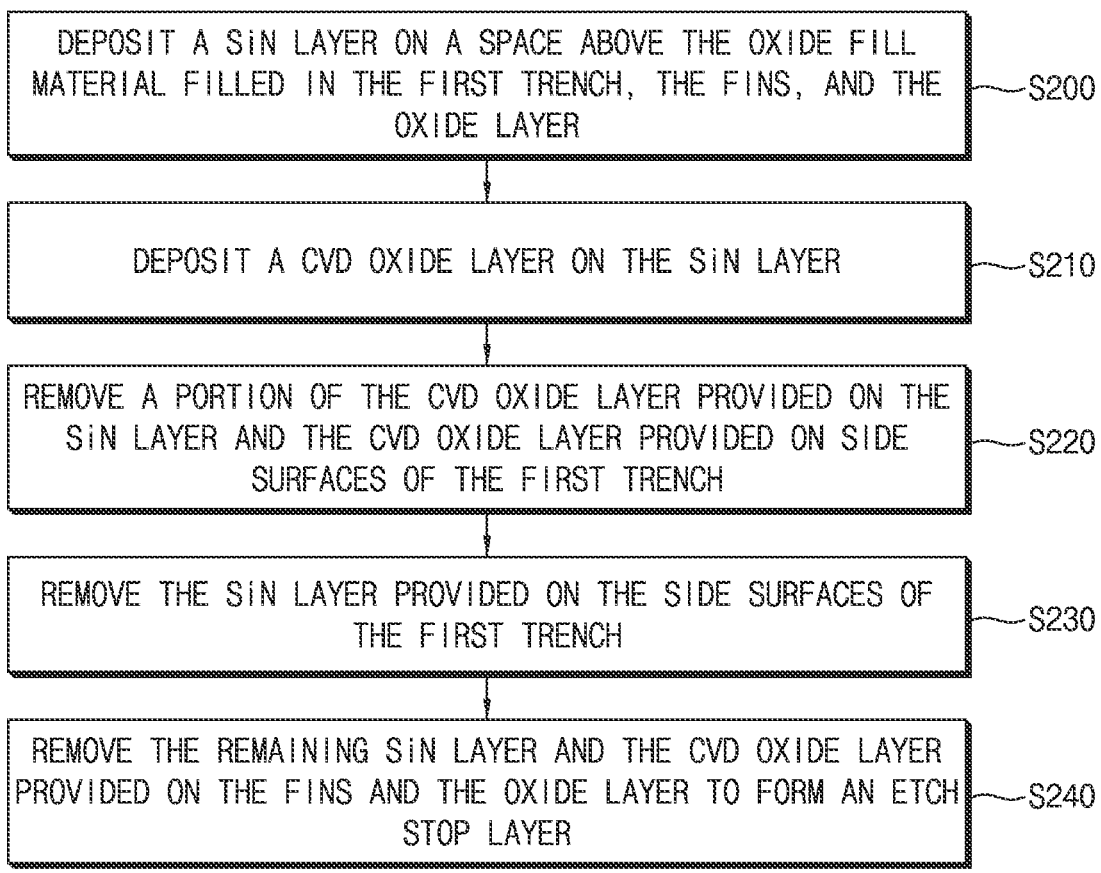
FIG. 12 illustrates a flowchart of a method of forming an etch stop layer according to an example embodiment.

FIG. 12 illustrates a flowchart of a method of forming an etch stop layer according to an example embodiment.

The method includes depositing a SiN layer on a remaining space above the oxide fill material in the first trench, the fins, and the oxide layer (S200). A chemical vapor deposition (CVD) oxide layer is deposited on the SiN layer (S210). A portion of the CVD oxide layer formed on the SiN layer and the CVD oxide layer formed on side surfaces of the first trench are removed by wet etching (S220). The SiN layer formed on the side surfaces of the first trench is removed by wet etching (S230). The remaining SiN layer and the CVD oxide layer formed on the fins and the oxide layer are removed to form an etch stop layer (S240).

Figure 13:
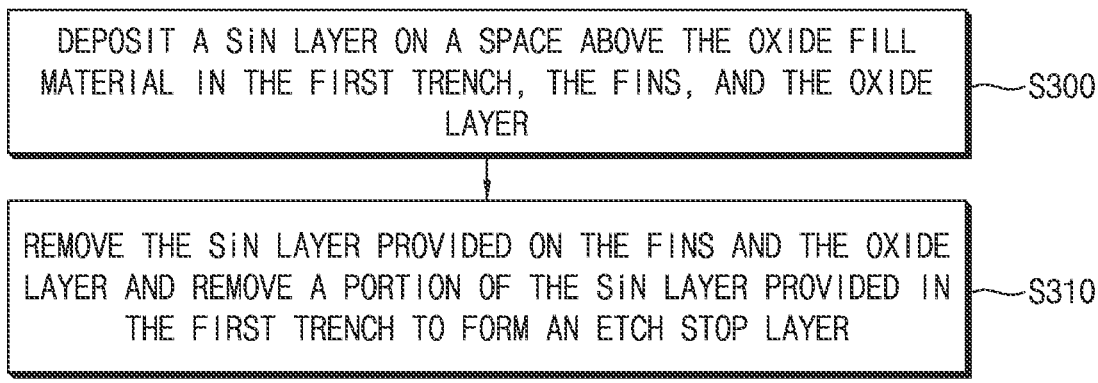
FIG. 13 illustrates a flowchart of a method of forming an etch stop layer according to another example embodiment.

FIG. 13 illustrates a flowchart of a method of forming an etch stop layer according to another example embodiment.

The method includes depositing a SiN layer on a remaining space above the oxide fill material in the first trench, the fins, and the oxide layer (S300). The SiN layer formed on the fins and the oxide layer is removed and a portion of the SiN layer formed on the first trench is removed to form an etch stop layer (S310).

Figure 14:
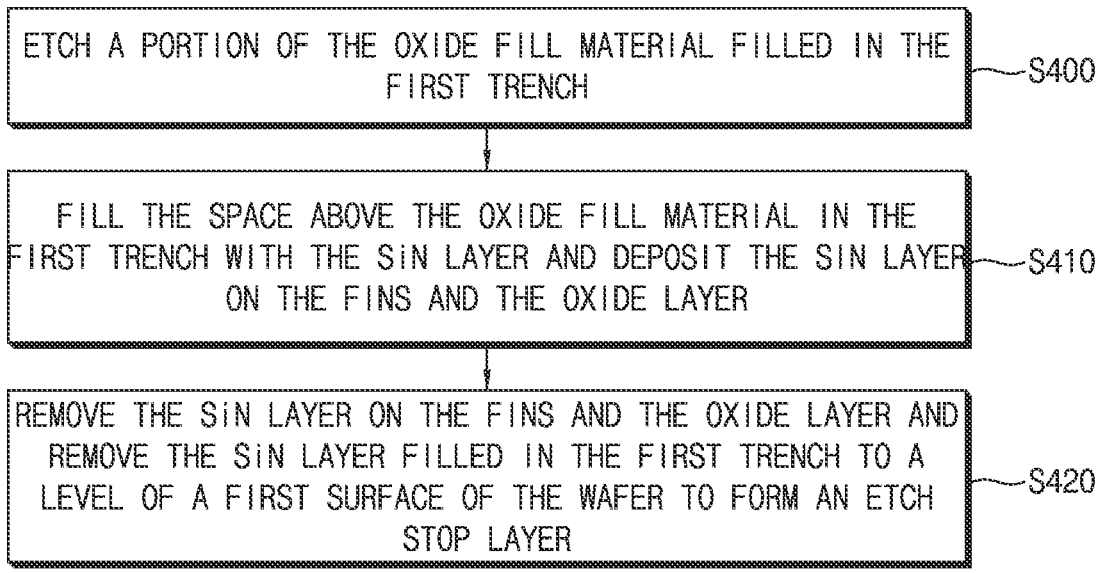
FIG. 14 illustrates a flowchart of a method of forming an etch stop layer according to another example embodiment.

FIG. 14 illustrates a flowchart of a method of forming the etch stop layer according to another example embodiment.

A portion of the oxide fill material filled in the first trench is etched to a level below the first surface of the wafer (S400). A remaining space above the etched oxide fill material in the first trench is filled with an SiN layer and the SiN layer is deposited on the fins and the oxide layer (S410). The SiN layer formed on the fins and the oxide layer is removed and the SiN layer filled in the first trench is removed to a level of a first surface of the wafer to form an etch stop layer (S420).

Figure 15:
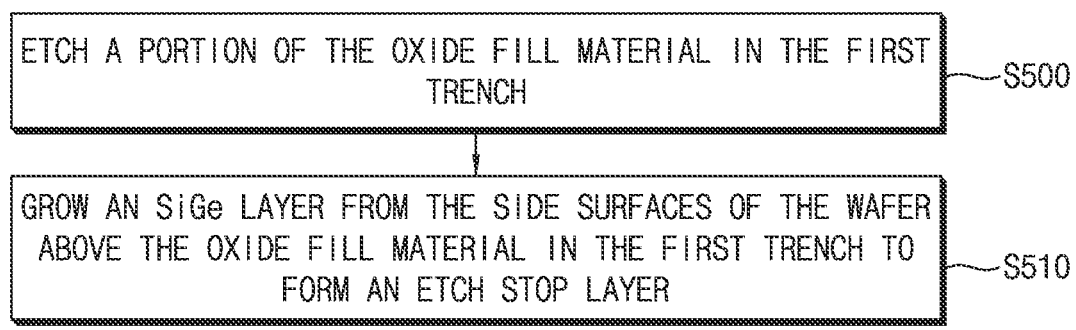
FIG. 15 illustrates a flowchart of a method of forming an etch stop layer according to another example embodiment.

FIG. 15 illustrates a flowchart of a method of forming the etch stop layer according to another example embodiment.

A portion of the oxide fill material in the first trench is etched to a level below the first surface of the wafer (S500). An SiGe layer is grown from the side surfaces of the wafer above the etched oxide fill material in the first trench to form an etch stop layer (S520).

Figure 16:
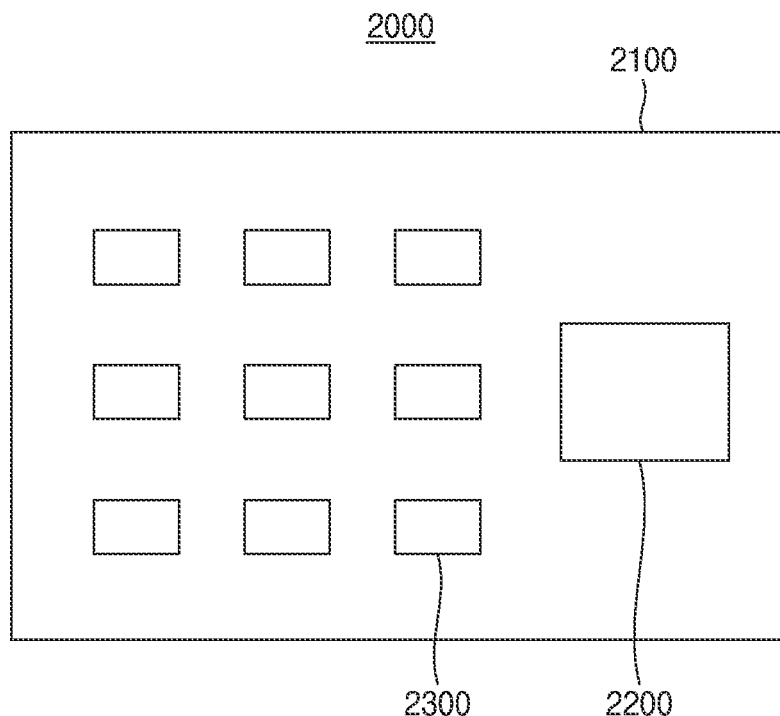
FIG. 16 illustrates a semiconductor architecture that may incorporate the BSPDN semiconductor architectures according to example embodiments.

FIG. 16 illustrates a semiconductor package that may incorporate the BSPDN semiconductor architectures according to example embodiments.

Referring to FIG. 16, a semiconductor package 2000 according to an example embodiment may include a processor 2200 and semiconductor devices 2300 that are mounted on a substrate 2100. The processor 2200 and/or the semiconductor devices 2300 may include one or more of BSPDN semiconductor architecture 1 described in the above example embodiments.

Figure 17:
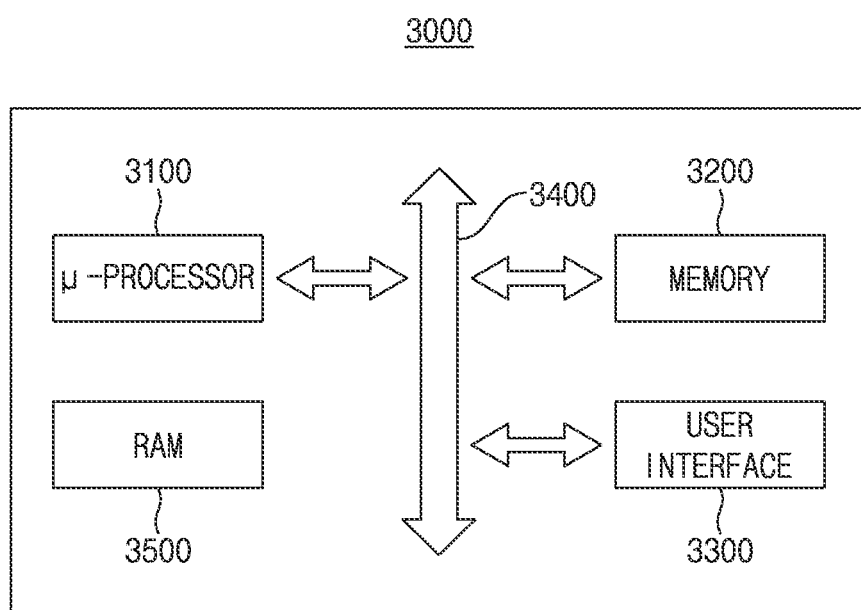
FIG. 17 illustrates a schematic block diagram of an electronic system according to an example embodiment.

FIG. 17 illustrates a schematic block diagram of an electronic system according to an example embodiment.

Referring to FIG. 17, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include BSPDN semiconductor architecture 1 as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A semiconductor architecture comprising:
   a carrier substrate;
   a first semiconductor device provided on a first surface of the carrier substrate, the first semiconductor device being configured to route signals;
   a second semiconductor device provided on a second surface of the carrier substrate opposite to the first surface of the carrier substrate, the second semiconductor device being configured to supply power; and
   a buried power rail (BPR) included inside of the carrier substrate and extending from the first surface of the carrier substrate to the second surface of the carrier substrate, the BPR being configured to deliver the power from the second semiconductor device to the first semiconductor device,
   wherein the second semiconductor device comprises power distribution network (PDN) metal lines.

2. The semiconductor architecture of claim 1, wherein a surface of the second BPR portion contacts a PDN metal line among the PDN metal lines that contacts the second surface of the carrier substrate.

3. The semiconductor architecture of claim 1, wherein the BPR includes one of copper (Cu), cobalt (Co), tungsten (W), and ruthenium (Ru).

4. A semiconductor architecture comprising:
   a carrier substrate;
   a first semiconductor device provided on a first surface of the carrier substrate, the first semiconductor device being configured to route signals;
   a second semiconductor device provided on a second surface of the carrier substrate opposite to the first surface of the carrier substrate, the second semiconductor device being configured to supply power; and
   a buried power rail (BPR) included inside of the carrier substrate and extending from the first surface of the carrier substrate to the second surface of the carrier substrate, the BPR being configured to deliver the power from the second semiconductor device to the first semiconductor device,
   wherein the BPR comprises a first BPR portion extending from the first surface of the carrier substrate and a second BPR portion extending from the second surface of the carrier substrate,
   wherein the first BPR portion and the second BPR portion are integrally formed.

5. The semiconductor architecture of claim 4, wherein a width of the first BPR portion is less than a width of the second BPR portion.

6. The semiconductor architecture of claim 4, wherein the first semiconductor device comprises:
   an epitaxial layer;
   an epitaxial contact provided on the epitaxial layer;
   a vertical contact provided on the epitaxial contact and extending to the first surface of the carrier substrate.

7. The semiconductor architecture of claim 6, wherein a surface of the first BPR portion contacts the vertical contact.

8. A semiconductor architecture comprising:
   a carrier substrate;
   a first semiconductor device provided on a first surface of the carrier substrate, the first semiconductor device being configured to route signals;
   a second semiconductor device provided on a second surface of the carrier substrate opposite to the first surface of the carrier substrate, the second semiconductor device being configured to deliver power;
a buried power rail (BPR) included inside of the carrier substrate and extending from the first surface of the carrier substrate to the second surface of the carrier substrate,
wherein the BPR comprises a first BPR portion and a second BPR portion,
wherein a width of the first BPR portion is different from a width of the second BPR portion,
wherein the first BPR portion extends from the first surface of the carrier substrate and the second BPR portion extends from the second surface of the carrier substrate, and
wherein the first BPR portion and the second BPR portion are integrally formed.

* * * * *